United States Patent [19]

Geis et al.

[11] Patent Number: 4,734,152
[45] Date of Patent: Mar. 29, 1988

[54] DRY ETCHING PATTERNING OF ELECTRICAL AND OPTICAL MATERIALS

[75] Inventors: Michael W. Geis, Acton; Nikolay N. Efremow, Melrose; Stella W. Pang, Arlington, all of Mass.

[73] Assignee: Massachusetts Institute of Technology, Cambridge, Mass.

[21] Appl. No.: 73,905

[22] Filed: Jul. 13, 1987

Related U.S. Application Data

[63] Continuation of Ser. No. 945,081, Dec. 22, 1986, abandoned.

[51] Int. Cl.$^4$ ............... H01L 21/306; C23F 1/02; B44C 1/22; C03C 15/00
[52] U.S. Cl. .................. 156/646; 156/656; 156/657; 156/662; 156/345; 204/192.32; 204/298
[58] Field of Search ............. 156/643, 646, 653, 656, 156/657, 659.1, 662, 668, 345; 204/192.32, 298; 252/79.1; 134/1

[56] References Cited

U.S. PATENT DOCUMENTS 4,233,109 11/1980 Nishizawa .................. 156/345 X
4,522,674 6/1985 Ninomiya et al. ............. 156/646 X
4,661,203 4/1987 Smith et al. .................. 156/646 X

OTHER PUBLICATIONS

"Hot Jet Etching of GaAs and Si", M. W. Geis et al., distributed at Electronic Photon and Ion Beam Conference, Jun. 1985.
Coburn et al., "Directional Etching with XeF$_2$ and Other Active Gases", IBM Tech. Discl. Bulletin, vol. 22, No. 4, Sep. 1979, p. 1640.
Geis et al., "Hot Jet Etching of GaAs and Si"; J. Vac. Sci. Technol. B4(1), Jan./Feb. 1986, pp. 315-317.

*Primary Examiner*—William A. Powell
*Attorney, Agent, or Firm*—Hamilton, Brook, Smith & Reynolds

[57] ABSTRACT

A new anisotropic dry etching system using a hot jet tube to heat and dissociate non-reactive source gas to form a directed flux of reactive specie or radicals for etching materials through openings in a resist or a reusable stencil of SiN$_x$ wherein x is in the range of 1.5 to 0.5. Si and GaAs may be etched using Cl$_2$, F$_3$, Br$_2$ or SF$_6$ source gasses. Pb or Hg, Cd, Te may be etched using n-butane, dimethyl ether or acetone as a source gas for CH$_3$ radicals. The tube may be formed of tungsten or where fluorine is used as a source gas, an irridium tube is preferred. Alternatively, a tube formed of rhenium or an alloy of rhenium and tungsten is preferred for some applications.

24 Claims, 8 Drawing Figures

DRY ETCHING PATTERNING OF ELECTRICAL AND OPTICAL MATERIALS

GOVERNMENT SPONSORSHIP

This invention was made in the course of work supported by the U.S. Air Force under Contract No. F19628-85-C-0002. This is a continuation of co-pending application Ser. No. 945,081, filed on Dec. 22, 1986, now abandoned.

BACKGROUND ART

In the manufacture of electronic or optoelectronic integrated circuits, an essential step is the patterning of a particular sequence of successive layers of insulative, semiconductive, conductive or optical material on a substrate. A common example is the patterning of a silicon dioxide ($SiO_2$) layer formed on an epitaxial silicon substrate for the purpose of selectively removing the insulating layer to expose the underlying silicon. Typically, a thin film of organic "resist" material is formed over the $SiO_2$ layer.

Next, a mask, comprising a transparent support material coated with a thin layer of opaque material engraved with the desired pattern, is placed on the resist surface. The engraved openings in the mask are located where it is desired to removed $SiO_2$ to expose the Si substrate.

An intense beam of ionizing radiation from a source of ultraviolet light, or laser energy or X-rays, is projected onto the back surface of the mask and breaks down the molecular structure of the organic resist at openings in the mask. The exposed resist material is dissolved by immersing the wafer in a suitable solvent. In this manner, the opaque mask geometry is transferred onto the resist material on the $SiO_2$ surface.

This resist pattern is now transferred to the $SiO_2$, itself, by exposing the wafer to a material that will etch $SiO_2$ but will not attack either the organic resist material or the Si substrate surface. This etching step is conventionally accomplished with hydrofluoric acid, which easily dissolves $SiO_2$, but is incapable of etching or dissolving the organic resist. Next, the remaining organic resist is removed by a suitable organic, or acid, solvent.

The above process is a positive resist process in which the resist material remaining after exposure and development, corresponds to the opaque mask areas. Negative resists are also in common use.

The process in the above example, wherein the resist or $SiO_2$ is etched away by an acid, is termed a wet-etching process. Wet etching processes are difficult to control because they lack sufficient anisotropic properties and, hence, result in an uncontrolled spread out of the etching width. Therefore, as requirements for patterning at the submicron level have developed, alternative anisotropic etching techniques have been developed using "dry" processes.

Anisotropic dry etching is usually accomplished with a combination of ions and chemically reactive species produced in a plasma from an unreactive gas. The ions are accelerated out of the plasma onto the material exposed through the resist where they initiate chemical reactions between the reactive species and the material forming volatile products. The directional nature of the ion flux is responsible for the anisotropic character of this etching technique.

Conventional dry anisotropic etching, used for semiconductor device fabrication, is accomplished by placing the material to be etched in a plasma. The plasma produces both ions and molecules with an incomplete bonding structure (radicals). The radicals are used to chemically react with the substrate forming volatile reaction products. The ions are used to initiate the reaction between the radicals and substrate. Since the ion flux is directional, the etching is substantially anisotropic.

While dry etching, as described above, is superior in many respects to wet etching, a number of disadvantages are present in the conventional systems. For example, ion bombardment is non-selective. Sputtering occurs. Thus, in addition to etching the $SiO_2$ material, the ion bombardment can etch adjacent resist material and underlying Si material.

Also, the ion beam can damage adjacent or underlying material. Gate oxides can be damaged by electrons and UV light emissions. The ion beam equipment is relatively expensive and complex. The etching rates are relatively slow, i.e., less than 1 micron per minute. For these and other reasons, a need exists for an improved anisotropic dry etching process.

DISCLOSURE OF THE INVENTION

In accordance with the present invention, anisotropic dry etching is accomplished by directing a hot jet, or flux, of a chemically reactive species obtained from the thermal decomposition of comparatively unreactive gasses. More specifically, the invention relates to heating of source gasses in a tube formed of rhenium or an alloy of tungsten and rhenium or irridium to a temperature in the range of about 900–3000° Kelvin to decompose such gasses and obtain a hot jet of reactive radicals.

The irridium (Ir) jet tube is specifically used in conjunction with a gas, such as $SF_6$, containing fluorine to produce a hot jet of fluorine radicals for etching silicon through openings formed in $SiO_2$.

The new dry etching system does not require either a plasma or ions. Radicals necessary for etching are obtained by thermally decomposing an unreactive gas in a heated tube. The reactive radicals are directed from the heated tube on to material to be etched. The etching is anisotropic by virtue of the directed flow and the fact that the radicals are selected to react chemically with the material to be etched but not with adjacent or underlying material.

This system can be used to etch substrates very quickly. For example, silicon can be etched at a rate of 3 micron/min with an anisotropic etching ratio (of the etch depth to under cutting distance) of 5. Previously, the fastest etching rate for Si was in the range of 1 micron/min. In the present invention, at lower etching rates (0.5 micron/min) the etching selectivity between Si and $SiO_2$ is approximately 1000 to 1, which is far in excess of any other known dry etching system.

This system may also be used to etch lead, Pb, which is an important material for superconducting devices. Previously, no known system for dry etching Pb had been available. Etching of lead is accomplished by decomposing butane which forms $CH_3$ radicals that react with Pb.

Etching may be accomplished through a reusable stencil mask formed of material not chemically active with the reactive radicals of the hot jet. For example, in etching Pb with $CH_3$ radicals, a stencil mask formed of $SiN_x$, wherein x is in the range of 0.5 to 1.5 is preferred.

BEST MODE OF CARRYING OUT THE INVENTION

Figure 1:
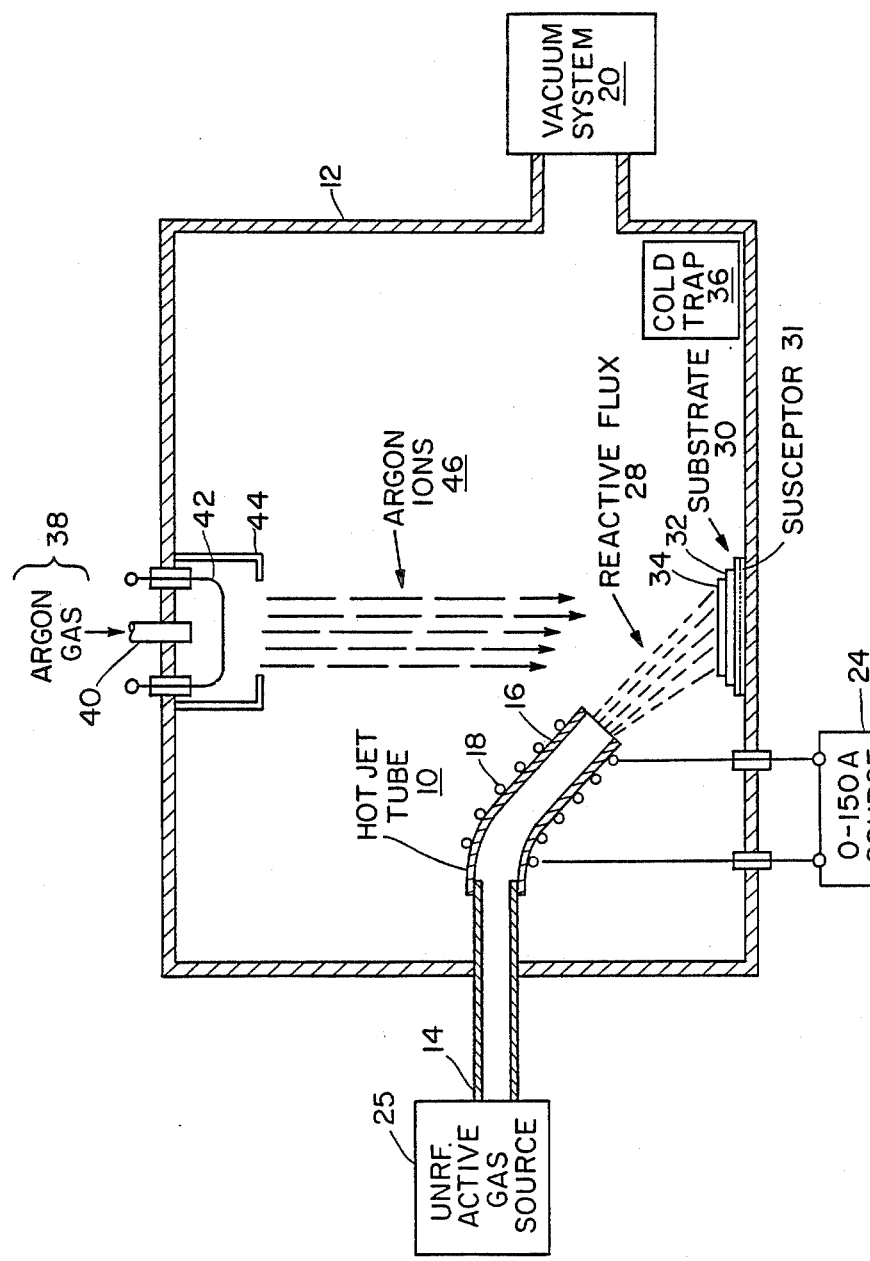
FIG. 1 is a schematic of the etching system of the invention.

Referring now to FIG. 1, the invention will now be described, in detail, in connection therewith. The apparatus of the invention comprises, in general, a stainless steel vacuum chamber 12 within which a substrate or wafer 30, having a film 32 formed thereon, may be mounted on an air-cooled heat sink susceptor 31 for etching. A reusable stencil or, alternatively, a resist 34 with patterned openings is placed or formed on the film 32 to define the areas in the film to be etched.

Optionally, a Kaufman ion source 42 using Argon gas 38 may be used to generate Argon ions, or equivalent, through a grid 44 to sputter clean the surface of the film prior to etching. A resistively heated tube 10, in the form of a metallic tube 16, encircled by a heater coil 28 is coupled to a current source 24. Alternatively, current can be passed from one end of the tube to the other to heat it.

Unreactive gasses from source 25 are coupled through an alumina, quartz or carbon tube 14 to the interior of hot jet tube 10, where the unreactive gas or gasses are disassociated to form a directed flux 38 of hot reactive species. A liquid nitrogen cold trap 36 is employed to pump both the unused reactive species and the reactive products.

The vacuum system 20 may consist of a 4-inch liquid nitrogen cold trapped diffusion pump with a base pressure of $5 \times 10^{-7}$ Torr.

Etching is accomplished by first sputter cleaning the face surface of the substrate through exposed openings with Argon ions, after which the ion beam is turned off and the reactive species 28, produced from the hot jet tube 10, are allowed to etch the exposed surface of film 32 through the resist or stencil or oxide openings.

The production of the reactive species depends upon the unreactive feed gas material in source 25, the temperature of the hot jet tube 10, and the chemical and thermal stability of the hot jet tube. Theoretically, any gas consisting of two or more elements can be decomposed at a sufficiently high temperature. However, because of tube material limitations, the hot jet tube cannot be operated above or below certain temperature limits.

Figure 2:
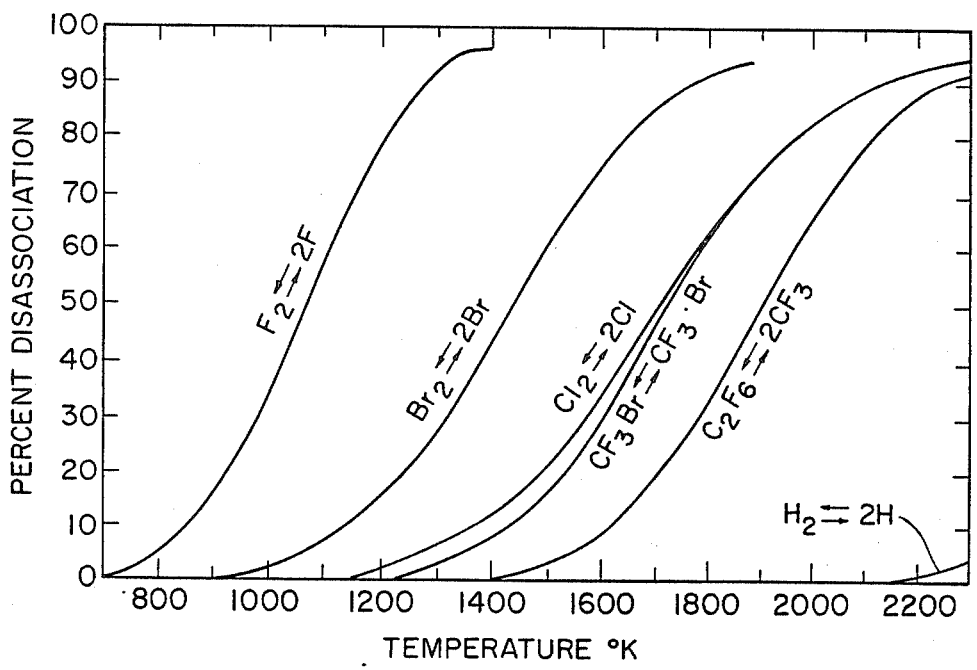
FIG. 2 is a plot of percent dissociation versus temperature in degrees Kelvin for various reactants.

The fractional dissociation of non-reactive gasses into free radicals for anisotropic etching depends upon the gas temperature and pressure. The calculated percentage of free radicals formed in a hot jet tube as a function of temperature is shown in FIG. 2. For a number of gasses, these calculations assume an estimated experimental room temperature pressure in the jet of 20 Torr. Since the mass flow of gas is held constant in these experiments, the gas pressure in the hot jet tube is assumed to increase with the square root of temperature and the percentage of gas dissociation. Gasses like $F_2$, $Br_2$, $Cl_2$, $CF_3Br$, and $CF_3CF_3$ can be easily decomposed into free radicals at temperatures less than 1800° K. However, gasses like $H_2$, $N_2$, or $CF_4$ require higher temperatures or lower gas pressures to obtain thermal decomposition.

The stability of the hot jet tube depends upon the material composition of the tube. In one experiment, a resistively heated tungsten tube was employed. It was heated to temperatures between 1500° and 2000° C. Chlorine was used as a feed gas. Chlorine is known to react with tungsten at temperatures above 300° C. forming a variety of volatile tungsten chlorides. However, at temperatures above 1500° C., tungsten becomes inert to $Cl_2$. This insures that the hot jet will operate with $Cl_2$, provided all the tungsten surfaces which will come in contact with $Cl_2$ are above 1500° C. Hot jet tubes have been operated with $Cl_2$ for up to an hour without degradation. However, when these tubes are operated below 1500° C., the $Cl_2$ will etch the tungsten tube away in less than 20 seconds. Gasses like $CF_3Br$ are comparatively unreactive and the tube material is not critical. Other gasses like $SF_6$ are very reactive with hot tungsten and although hot jet tubes have been operated with this gas for tens of minutes, the tube will more commonly etch away in a few seconds. Using the hot jet tube system of the invention, a variety of materials have been etched, as shown in Table 1, below:

TABLE 1

| | | Hot jet etching (units nm min$^{-1}$) | | | |
|---|---|---|---|---|---|
| | Source | Etched Material | | Thermal | Photoresist |
| Examples | Gas | GaAs | Si | SiO$_2$ | (Novolac) |
| 1 | Cl$_2$ | 2–5* | 10 | <0.1 | <0.1 |
| 2 | CF$_3$Br | 10 | 10 | <0.1 | <0.1 |
| 3 | SF$_6$ | <0.1 | 200–300 | <0.1 | <0.1 |

*$\mu$m min$^{-1}$

These etching rates were obtained with a hot jet exit pressure estimated between 20 and 60 Torr, a sample flux equivalent pressure between 3 and 10 mTorr, and a hot jet temperature between 1000° and 3000° C. or Kelvin.

Since there is no ion beam used during the etching of the samples, except to sputter clean the sample surface, high differential etching rates are possible. This results from the fact that the ion beam etches, to some extent, everything the ions hit, whereas gas sources used herein are selected to produce radicals which selectively etch only the desired material. For example, in the examples given in Table 1, only the GaAs or Si is etched to any substantial extent, while the SiO$_2$ or resist remains substantially intact. Thus, the etching rates of the photoresist and SiO$_2$ were too small to measure, i.e., 0.1 nm min$^{-1}$, when Cl$_2$ was used as a feed gas. Even a few nanometers-thick native oxide on top of the GaAs sample is sufficient to mask the sample during etching.

Figure 3:
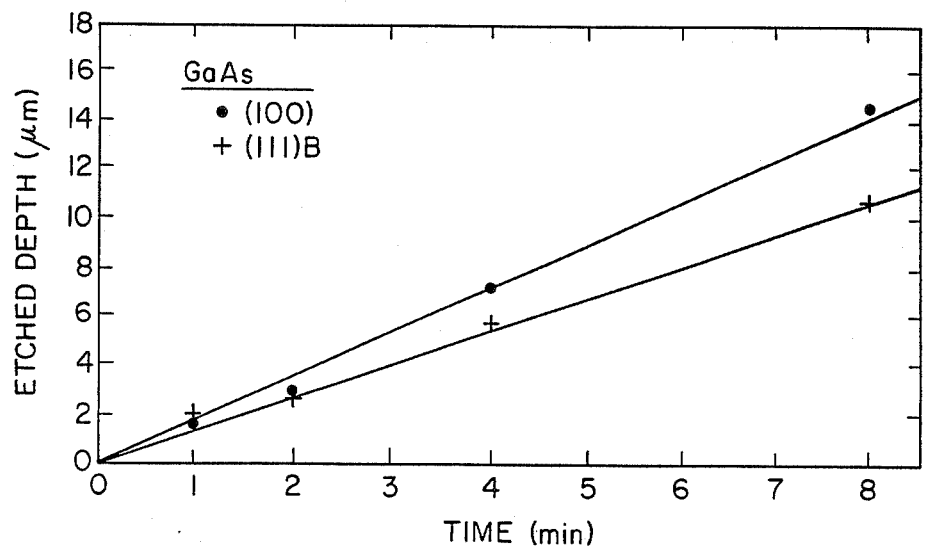
FIG. 3 is a plot of etched depth in microns versus time in minutes for GaAs for two crystollographic planes •=(100) plane and +=(111) B plane.

Since there is no ion beam used during the etching, any accumulation of material on the etching surface from the hot jet or the vacuum system may cause the reduction of the etching rate. To check for this, the etch depth into GaAs was plotted as a function of the etching time, as shown in FIG. 3. The etch depth is a linear function of the etching time, indicating that there is no evidence of contamination. Etched depths as deep as 75 microns have been obtained without any indication of the etch rate diminishing.

The etch rate for $Cl_2$ feed gas on GaAs was found to be linearly dependent upon the equivalent flux pressure of reactive species on the sample, up to a pressure of 6 mTorr. Above 6 mTorr, the etching rate became nearly constant.

The anisotropic nature of the etching technique was proven by a scanning electron micrograph of an etched GaAs sample. The etched depth is approximately 50 microns with 10 microns of undercutting. An anisotropic etch ratio of the etch depth to the undercutting distance of 5, is acceptable for some device fabrication and etched through holes in GaAs wafers. Etching uniformity better than 10% was obtained over an area 4 cm in diameter.

In improved embodiments of the invention, the tungsten hot jet tube was replaced by a tungsten/rhenium alloy tube or an irridium or rhenium tube allowing much higher temperatures, i.e., up to 3000° C. to be attained, without noticeable tube degradation.

Lead, gallium arsenide and silicon may be etched, in accordance with the invention, as described in the following examples:

EXAMPLE I: ETCHING Pb

The Pb samples used in these etching examples consisted of 0.5- to 3- micron thick, RF-sputter-deposited films of Pb on Si substrates. Standard photolithography was used to obtain 100-nm-thick resist patterns of Novolac organic resin resist material on the Pb films. Etching was accomplished by first sputter-cleaning the Pb surface with a 0.1-mA cm$^{-2}$ beam of 500-eV Ar+ ions for 1 min, which removes less than 10 nm of the Pb film. After the cleaning, the source-gas flow is established at approximately 1 mTorr of flux-equivalent pressure on the sample. Next, the jet tube, which is usually formed from tungsten foil, is heated to its operating temperature. Several source gasses, including n-butane ($C_4H_{10}$), dimethyl ether (($CH_3)_2O$), and acetone (($CH_3)_2CO$), have been used, resulting in etch rates in excess of 100 nm min$^{-1}$.

Depending upon the etching conditions, after 0.5 to 1 microns of Pb is etched a protective film forms on the sample which terminates the etching. Sputter cleaning, using ion source 42, may be used to remove this film and allow hot-jet etching of the Pb until the protective film reforms. By using this system of alternate hot-jet etching and sputter cleaning, nearly vertically etched structures can be obtained. A 3-μm-thick Pb film was etched completely through by 12 iterations of a 30-s sputter cleaning and a 1-min hot-jet etching with dimethyl ether. The sputtering alone etches approximately 100 nm of the Pb film.

The source gas, n-butane, is believed to decompose at jet temperatures in excess of 900° C. into methyl ($CH_3$), ethyl ($CH_3CH_2$), and propyl ($CH_3CH_2CH_2$) radicals by the reactions:

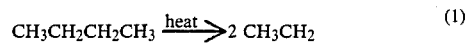

$$CH_3CH_2CH_2CH_3 \xrightarrow{heat} 2\ CH_3CH_2 \quad (1)$$

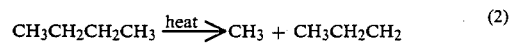

$$CH_3CH_2CH_2CH_3 \xrightarrow{heat} CH_3 + CH_3CH_2CH_2 \quad (2)$$

Figure 4:
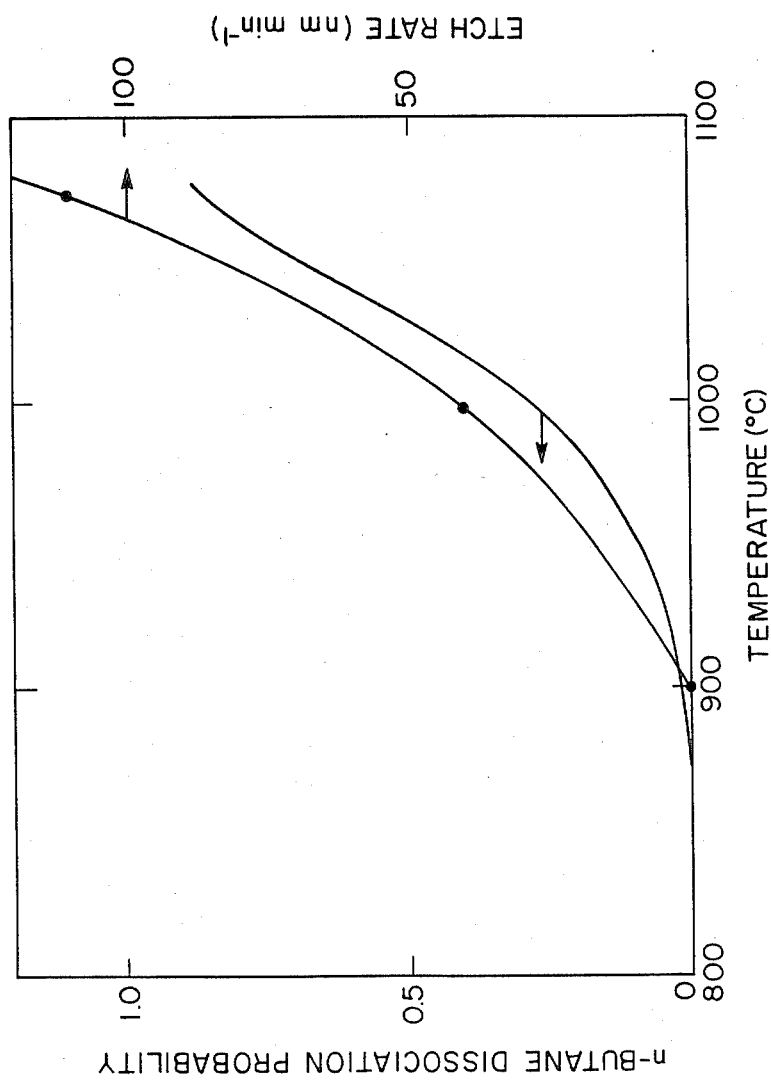
FIG. 4 is a plot of the dissociation rate of n-butane and the observed lead etching rate as a function of temperature in degrees Centigrade.

Reactions (1) and (2) are believed to occur with equal probability. The dissociation probability of n-butane and the observed Pb etching rate as a function of temperature is shown in FIG. 4. The lead is believed to be etched by the reaction

$$Pb(s) + 4\ CH_2R \rightarrow Pb(CH_2R) \quad (3)$$

where R represents one of the radicals H, $CH_3$, or $CH_3CH_2$. Etching rates as high as 0.6 microns min$^{-1}$ have been obtained with a n-butane flux-equivalent pressure of 1 mTorr. This is consistent with approximately one-quarter of the maximum available radicals, which could be formed by reactions (1) and (2), reacting with the Pb film. Tin and several transition elements, such as Zn, Cd, Te, Hg, have been etched with these methyl and ethyl radicals. So far, Ge, Si, GaAs, and InP have exhibited no measurable etching rates, using the above reactants, although these elements are known to form volatile compounds with methyl and ethyl radicals.

EXAMPLE II: ETCHING GaAs

The hot jet etching system can also be used to etch GaAs through openings in a resist formed of post-baked Novolac-resin photoresist. In this process, chlorine is usually used to etch GaAs by the following reactions:

$$Cl_2 \xrightarrow{HOT\ JET} 2\ Cl \quad (4)$$

$$6\ Cl + GaAs(s) \longrightarrow GaCl_3 + AsCl_3 \quad (5)$$

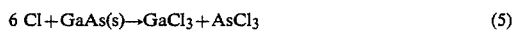

$$6\ Cl + GaAs(s) \rightarrow GaCl_3 + AsCl_3 \quad (5)$$

The effect shown in Table 1 was found to increase by replacing the tungsten jet with jets formed from an alloy of 20% rhenium and tungsten or a pure rhenium. This increase in etching anisotropy may be the result of reduced contamination of the GaAs surface with the marginally volatile tungsten chloride salts formed in the jet. An etching anisotropy ratio of the etched depth to the undercutting distance of approximately 10, has been obtained in GaAs using such a tungsten rhenium alloy jet.

Figure 5:
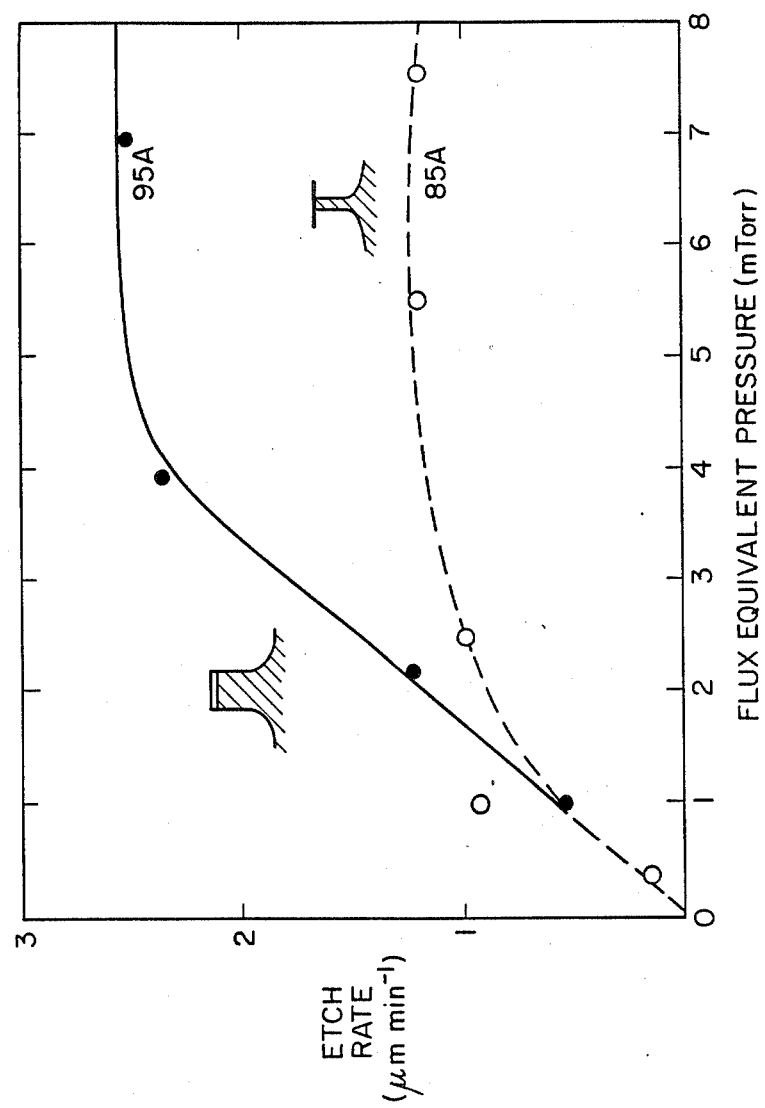
FIG. 5 is a plot of etch rate in micron/minute versus chlorine flux equivalent pressure in miliTorr for two different jet temperatures related to two different heating currents, i.e., 95 amperes and 85 amperes.

The etching rate and anisotropy were found to depend upon both the jet temperature and the $Cl_2$ pressure, as shown in FIG. 5. Note: An estimated average residence time of a molecule in the hot jet, which is used to calculate the dissociation probability, was obtained by dividing the length of the hot jet by the average molecular velocity. The estimated average residence time at 1000° C. is 58 μsec. Since it is difficult to characterize the actual internal jet temperature, the current used to heat the jet is used as a general indication of the jet temperature. At the lower current, 85A, the resulting temperature is estimated to be 2600° K, by equating the resistively dissipated power in the jet to power loss by radiation. The etching rate saturates at about 1 mTorr of flux equivalent pressure of $Cl_2$. At the higher current, 95A, the temperature is estimated to be 2800° K. and the etching rate saturates at approximately 4 mTorr of flux-equivalent pressure. In the saturated etching rate region, the etched structures had low etching anisotropy ratios of about 2 for a current of 85A at a flux equivalent pressure of 7.5 mTorr. Etched structures exhibited etching anisotropy ratios of about 10, when etched with a jet current of 95A and at pressures below 4 mTorr.

It is believed that the efficiency of dissociation of the $Cl_2$ molecules, which determines the etching rate, decreases with the increase in $Cl_2$ pressure and increases with an increase in temperature. At low $Cl_2$ pressures or high heater currents, the majority of the reactive flux is in the form of Cl and the etching rate increases with pressure. At higher pressures or lower jet temperatures, $Cl_2$ dissociation is less and the etching remains constant with an increase in pressure. Under low pressure and high temperature conditions approximately 50% of the maximum available chlorine flux reacts with the sample.

EXAMPLE III: ETCHING SILICON

Figure 6:
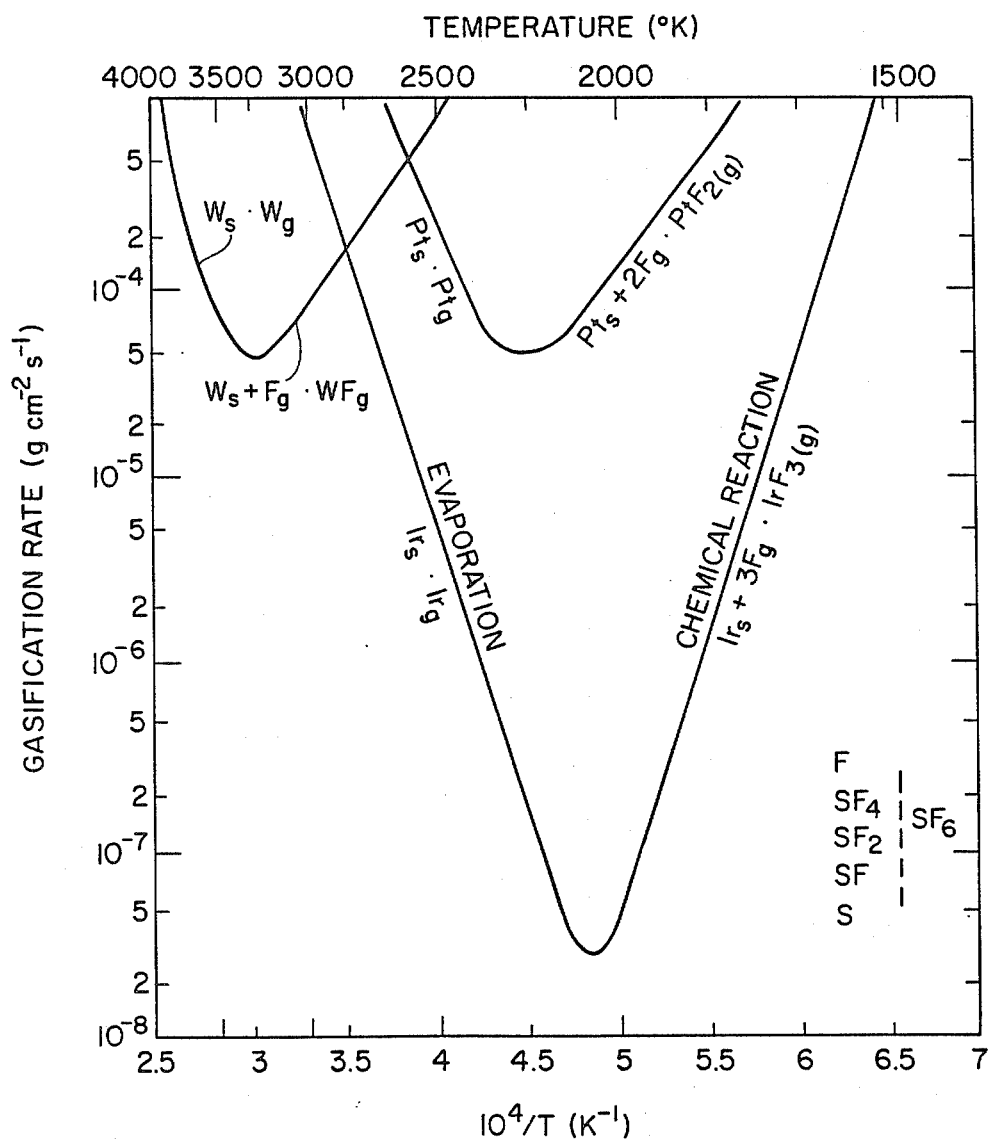
FIG. 6 is a plot of the gasification rate of tungsten (W), platinum (Pt) and irridium (Ir), as a function of temperature.

Silicon may be etched through openings in $SiO_2$ or silicon nitride with a fluorine flux obtained from the thermal decomposition of a source gas of $SF_6$. Since F is extremely reactive, the jet tube material is critical. At low temperatures (<3000° K.), F reacts with the tungsten jet tube to form a variety of tungsten salts and the jet tube, itself, is etched away. At higher temperatures (>3000° K.), these salts will decompose into W and F and the tungsten jet tube will become less reactive. However, at still higher temperatures (>3500° K.), the W will evaporate and the jet tube will fail in a short time. FIG. 6 shows the gasification rate of W, Pt, and Ir as a function of temperature. The optimum operating temperature for etching Si with a tungsten jet is between 3000° and 3500° K. However, even at these temperatures, there is substantial loss of tungsten metal. Consequently, one is only able to operate for as long as 40 minutes before the tungsten jet tube fails. Platinum is more inert than tungsten, but its higher evaporation rate makes it unsuitable for jet tube material, because the evaporated Pt masks the sample and stops the etching.

We have found that Ir is the optimum material for the jet tube. In practice, Ir jet tubes have operated for several hours without any sign of deterioration, provided they are operated between 1750° and 2500° K. However, Ir jets do not provide as high etching rates as similar jets formed from W.

Table 2, below, summarizes the etching rates for a variety of materials using several sources gasses. Note that the differential etching rate between $SiO_2$ and Si is in excess of 1 in 1000.

TABLE 2

| SOURCE GAS | GaAs | Si | $SiO_2$ | Pb | PH | Au |
|---|---|---|---|---|---|---|
| $Cl_2$ | $1 \times 10^4$ | 10 | <0.1 | | <0.1 | <1 |
| $SF_6$ | | $2 \times 10^3$ | <2 | | <2 | |
| $C_4H_{10}$ | <5 | | | $6 \times 10^2$ | <2 | <2 |

Hot-jet etching rates (nm min$^{-1}$) of a variety of commonly used materials for several source gasses. The jet-to-sample distance in these Examples is approximately 10 cm with the exception of the etching rate measurements made with GaAs, for which the jet-to-sample distance was approximately 4 cm. (100)-cut, n-type GaAs and Si samples were used to determine the etching rates. $SiO_2$ films were obtained by thermal oxidation of Si wafers, and PH is a Novolac-resin photoresists.

Hot Jet Etching with Stencil Masks

Figure 7:
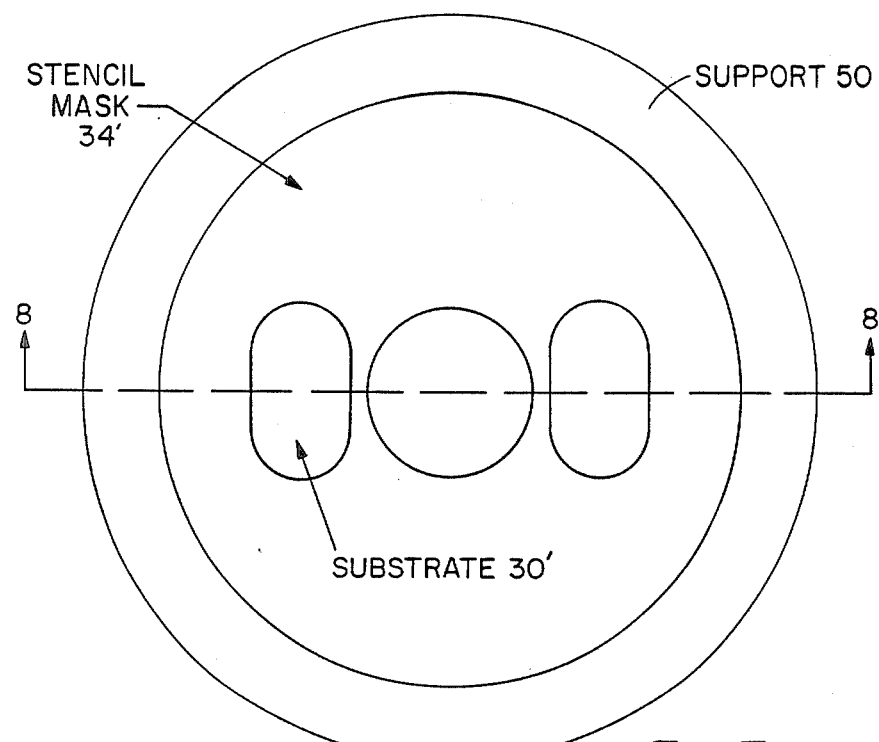
FIG. 7 is a top planar view of the use of a reusable sterile mask in accordance with the invention.
Figure 8:
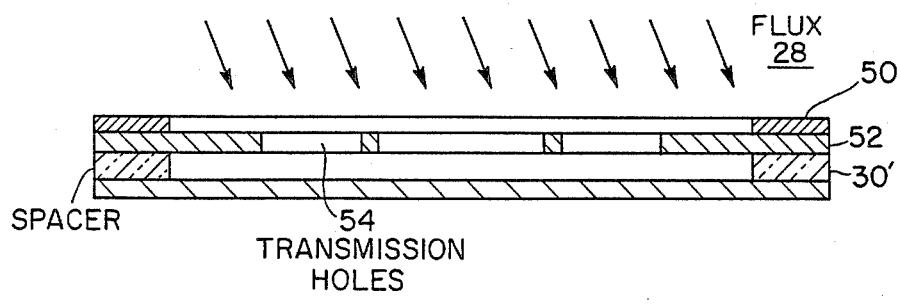
FIG. 8 is a cross-sectional view taken along lines 8—8 of FIG. 7.

Details of the stencil mask embodiment of the invention are shown in FIGS. 7 and 8. The stencil masks 34' comprise $SiN_x$ membranes 52 supported on Si substrates, with transmission holes 54 lithographically formed therein to define a pattern to be etched in a substrate 30'. Submicrometer features for different devices have been defined in these stencil masks.

Conventional procedures for pattern definition involve a lithography step, a wet chemical development step, and an etching step. However, using hot jet etching with stencil masks, it is possible to eliminate the lithography and development steps. The stencil masks are placed directly over the substrates 30', with or without a spacer in-between, and the patterns on the stencil masks are then transferred directly to the material underneath by hot jet etching using a flux 28 of suitable reactant radicals. A potential problem for using stencil masks in combination with other dry etching techniques is damage to the stencil masks due to ion bombardment. Since hot jet etching does not employ ion bombardment on the materials, the high differential etching rates allow stencil masks to be used repeatedly for etching. In accordance with the above-described invention, GaAs samples were etched through $SiN_x$ stencil masks with feature sizes below 100 nm.

Hot jet etching with stencil masks is a new pattern definition technique which allows lithography steps and wet chemical development steps to be eliminated which will, in turn, provide higher yield and throughput for device fabrication.

Equivalents

While preferred embodiments have been shown and described above, various other equivalent embodiments and modifications will become apparent to those skilled in the art based upon the description provided herein. For example, in addition to the source gasses previously described, the following is a list of equivalent gasses and radicals produced:

| Gas | Radical |
|---|---|
| $Pb(CH_3)_4$ | $CH_3$ |
| $NF_3$ | F |
| $CF_4$ | F |
| $CCl_4$ | Cl |
| $SiCl_4$ | Cl |

Also, the following significant integrated circuit or optoelectronic etchable materials are listed, together with suggested suitable reactant flux radicals or molecules for anisotropic etching thereof:

| Material To Be Etched | Radical/or Molecule |
|---|---|
| GaAs | Cl |
| Si | Cl or F |
| InP | Cl and $CH_3$* |
| HgCdTe, Se | $CH_3$ |
| AlGaAs | Cl |
| InGaAs | Cl and $CH_3$* |
| W | F |
| WSi | F |
| $SiO_2$ | H |
| $SiN_x$ | F |
| Ge, Sn, Si, As | H |
| Organic Photoresist | O |

*Note: In this case, more than one radical is required to etch different materials.

This completes the description of the preferred embodiments of the invention. Since numerous modifications and changes will occur to those skilled in the art, it is not intended that the invention be limited to the exact construction and operation shown and described herein. Accordingly, all suitable modifications and equivalents are intended to fall within the scope of the following claims.

We claim:

1. Apparatus for etching a first material through openings formed in a mask, comprising:
   (a) a source of feed gas containing species which are chemically reactive with respect to said first material when dissociated from said gas by heating;
   (b) a reusable stencil mask over said first material and formed of a second material which is not chemically reactive with respect to said species;
   (c) heater means for heating said feed gas to a temperature which dissociates said gas and forms species of said gas which react with said first material to etch said first material without substantially etching said second material.

2. The apparatus of claim 1 wherein the heater means comprises a heatable hollow tube having a proximal and distal end, the distal end of which is directed at the openings and the proximal end of which is coupled to said source of feed gas.

3. The apparatus of claim 2 wherein the tube is formed of rhenium.

4. The apparatus of claim 2 wherein the tube is formed of irridium.

5. The apparatus of claim 2 wherein the tube is adapted to be resistively heated to a temperature in a range of 900 to 3000 degrees Kelvin.

6. The apparatus of claim 1 wherein the source gas is taken from the group comprising hydrogen, fluorine, chlorine, bromine, methane and ethane.

7. The apparatus of claim 2 wherein the tube is formed of metal from the group comprising rhenium and irridium, or an alloy thereof, the source gas is chlorine, the first material is GaAs and the second material is $SiN_x$ wherein x is in the range of 1.5 to 0.5.

8. The apparatus of claim 2 wherein the tube is formed of irridium, the source gas is fluorine or a compound containing fluorine, and the first material is silicon; and the temperature is between about 1750° and 2500° K.

9. The apparatus of claim 2 wherein the source gas is taken from the group comprising n-butane, dimethyl ether or acetone and the first material is lead.

10. Apparatus for etching a first material through openings formed in a second material, comprising:
    (a) a source of feed gas containing radicals which, when separated by thermal energy, are chemically reactive with said first material and chemically unreactive with said second material;
    (b) heater means for heating said gas to a temperature which dissociates said gas and forms said radicals of said gas which react with said first material to etch said first material without substantially etching said second material; and wherein the heater means comprises a hollow heatable tube having a distal and proximal end, the distal end of which is directed at the openings and the proximal end of which is coupled to said source of feed gas; and wherein said tube is formed of a metal from the group comprising irridium or rhenium or an alloy thereof.

11. The apparatus of claim 10 wherein the tube is adapted to be resistively heated by an encircling wire coil through which current is passed.

12. The apparatus of claim 10 wherein the source gas is taken from the group comprising: hydrogen, fluorine, chlorine, bromine, methane and ethane.

13. The apparatus of claim 10 wherein the source gas is chlorine, the first material is GaAs and the second material is a photoresist.

14. The apparatus of claim 10 wherein the source gas is fluorine or a compound containing fluorine, and the first material is silicon while the second material is $SiO_2$; and the temperature is between about 1750° and 3300° K.

15. The apparatus of claim 10 wherein the source gas is taken from the group comprising n-butane, $Pb(CH_3)_4$, dimethyl ether or acetone and the first material is lead while the second material is a photoresist.

16. The apparatus of claim 10 wherein the source gas contains fluorine and the first material is tungsten or silicon nitride.

17. The apparatus of claim 10 wherein the source gas contains hydrogen and the first material is $SiO_2$, Ge, Sn, Si or As.

18. The apparatus of claim 10 wherein the source gas contains Cl and $CH_3$ radicals and the first material is InP or InGaAs.

19. The apparatus of claim 10 wherein the source gas contains $CH_3$ radicals and the first material is HgCdTe or Pb, Zn, Sn, As, Se, Cd or Te.

20. The apparatus of claim 10 wherein the source gas contains Cl radicals and the first material is from the group comprising Si, AlGaAs, and GaAs.

21. The apparatus of claim 10 wherein the source gas contains H radicals and the first material is from the group comprising Ge, Sn, Si, As, $SiO_2$.

22. The apparatus of claim 10 wherein the source gas contains oxygen radicals and the first material is from the group comprising organic photoresist.

23. A method for anisotropic etching of substrate material through openings formed in a mask comprising the steps of:
    (a) providing a source of gas containing radicals which, when heated, dissociate said radicals being capable of volatilizing said substrate material but not said mask material;
    (b) heating said gas to dissociate said radicals and directing said heated gas toward said openings to volatilize said material using a rhenium or irridium hot metal tube having a proximal end coupled to said gas source and an open distal end facing said openings.

24. The method of claim 23 wherein the mask is a reusable stencil formed of $SiN_x$ where "x" is in the range of about 1.5 to 0.5.

* * * * *